United States Patent [19]

Linder et al.

[11] Patent Number: 4,562,414
[45] Date of Patent: Dec. 31, 1985

[54] DIGITAL FREQUENCY MODULATION SYSTEM AND METHOD

[75] Inventors: Donald L. Linder, Palatine; William R. Murphy, Chicago, both of Ill.

[73] Assignee: Motorola, Inc., Schaumburg, Ill.

[21] Appl. No.: 565,947

[22] Filed: Dec. 27, 1983

[51] Int. Cl.$^4$ .............................................. H03C 3/00
[52] U.S. Cl. ................................ 332/9 R; 332/16 R; 332/19
[58] Field of Search ............ 332/9 R, 16 R, 19, 30 V; 455/112, 119

[56] References Cited

U.S. PATENT DOCUMENTS

| | | | |
|---|---|---|---|
| 3,781,706 | 12/1973 | Osborne et al. | 331/45 |
| 4,110,706 | 8/1978 | Matsumoto et al. | 332/19 |
| 4,119,925 | 10/1978 | Bosselaers | 331/1 A |
| 4,296,407 | 10/1981 | Minakuchi | 340/347 CC |

FOREIGN PATENT DOCUMENTS

| | | | |
|---|---|---|---|
| 0073107 | 6/1980 | Japan | 332/16 R |
| 2046541 | 11/1980 | United Kingdom | 332/19 |

Primary Examiner—Eugene R. LaRoche
Assistant Examiner—Robert J. Pascal
Attorney, Agent, or Firm—John S. Paniaguas; Donald B. Southard; Edward M. Roney

[57] ABSTRACT

There is disclosed a new and improved frequency modulation system and method for providing a frequency modulated signal which varies in frequency from a center frequency in response to the amplitude of an analog modulating signal. The system and method utilizes a frequency shift synthesizer to provide the frequency modulated signal and digital techniques for quantizing the amplitude modulating signal and providing dividing factors to the frequency shift synthesizer responsive to the amplitude quantization.

29 Claims, 5 Drawing Figures

DIGITAL FREQUENCY MODULATION SYSTEM AND METHOD

FIELD OF THE INVENTION

The present invention relates to a new and improved frequency modulation system and method for providing a frequency modulated signal which varies in frequency from a center frequency in response to a characteristic of a modulating signal. The present invention more particularly relates to such a system and method which utilizes a frequency shift synthesizer to provide the frequency modulated signal and digital techniques for quantizing the amplitude of an analog modulating signal and providing dividing factors to the frequency shift synthesizer responsive to the amplitude quantization.

BACKGROUND

A mode of radio communication known as frequency modulation finds considerable use in both commercial broadcasting and private radio communication systems. As known in the art, a frequency modulated signal is of substantially constant amplitude but varies in frequency about a center frequency by a deviation related to the amplitude of a modulating signal, such as a voice audio signal.

Prior art frequency modulation systems have generally been analog systems which process the modulating signal and generate the frequency deviations in an analog, as opposed to a digital, manner. While such analog systems are generally successful, they are not readily adaptable to integration on integrated circuit chips. As a result, such systems cannot generally take full advantage of the reduced size and cost which integrated circuit technology has to offer. Also, analog systems have a tendency to be unstable, requiring periodic testing and adjustment to make sure that the emitted frequency modulated signals conform to government regulations.

It is therefore a general object of the present invention to provide a new and improved system and method for generating a frequency modulated signal utilizing digital techniques.

It is a further object of the present invention to provide such a system and method which utilizes a frequency shift synthesizer which can be digitally programmed for generating the frequency modulated signal.

It is still a further object of the present invention to provide such a system and method wherein the modulating signal can be pre-processed digitally to provide integrated processing and exact frequency deviation.

SUMMARY OF THE INVENTION

The present invention therefore provides, in a frequency modulation system of the type which transforms a modulating signal to a signal substantially constant in amplitude but varying in frequency from a center frequency responsive to a characteristic of the modulating signal, the improvement comprising frequency synthesizer means including an output and a frequency control input for receiving digital frequency control signals and for varying the frequency at the output by an amount related to the digital frequency control signals, and digital frequency control signal generating means coupled to the control input for providing the control input with the digital frequency control signals in response to the characteristic of the modulating signal.

The invention further provides a method of providing a signal varying in frequency from a center frequency by an amount related to a characteristic of a modulating signal. The method includes the steps of providing a frequency synthesizer of the type having an output and a frequency control input and which varies the output frequency in response to digital frequency control signals received at the control input, generating the digital frequency control signals in response to the characteristics of the modulating signal, and conveying the digital frequency control signals to the control input.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numerals identify identical elements, and wherein:

DESCRIPTION OF THE PREFERRED EMBODIMENTS

Figure 1:
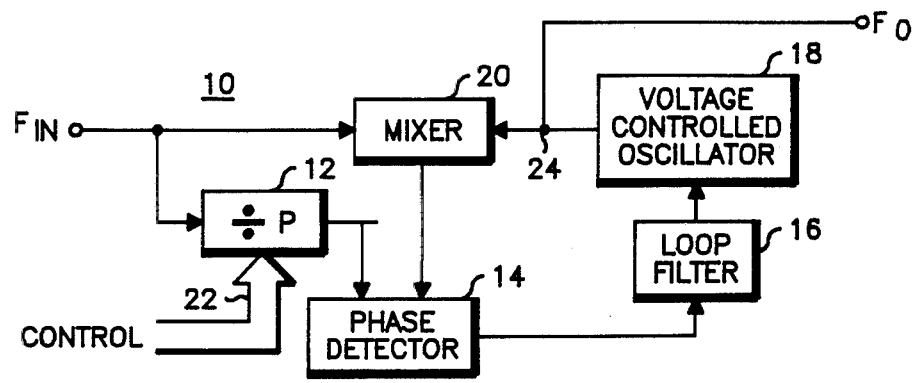
FIG. 1 is a block schematic diagram of a frequency shift synthesizer of the type which can be utilized in practicing the present invention.

Referring now to FIG. 1, it illustrates a frequency shift synthesizer of the type which can be utilized in practicing the present invention. The frequency shift synthesizer 10 generally includes a programmable frequency divider 12, a phase detector 14, a loop filter 16, a voltage controlled oscillator (VCO) 18, and a mixer 20. The mixer 20 and programmable divider 12 have inputs which are adapted to be coupled to a reference oscillator (not shown) which provides a substantially constant amplitude signal at a substantially constant frequency ($F_{in}$). The programmable frequency divider 12 has an output coupled to the phase detector 14 and divides the input frequency ($F_{in}$) by frequency control dividing factors (P) impressed upon a control input 22. The mixer 20, phase detector 14, loop filter 16, and VCO 18 are coupled together in a well known manner to form a phase locked loop. The frequency shift synthesizer, and more particularly the VCO 18, has an output 24 which provides an output signal having a frequency ($F_o$) which deviates from a center frequency by an amount related to the dividing factors (P) inputted to the control input 22 of the programmable frequency divider 12. In actual practice, the control input can be an 8-bit digital input.

When the frequency shift synthesizer of FIG. 1 is utilized in the frequency modulation system to be described hereinafter, the output 24 will provide a frequency modulated signal having a frequency deviation related to the amplitude of an analog modulating signal, such as a voice audio signal, which has been quantized, and from which the dividing factors are derived.

The digital frequency modulation systems of the present invention can provide an output frequency ($F_o$) which is stepped in very small increments, as described in the following equation:

$$F_o = F_c + \Delta f \times M'$$

where:

$F_c$ is the center value for the output
$\Delta f$ is an ideal frequency increment (step size)
$M'$ is the quantized amplitude of the modulating signal about its center value. That is, $M'$ can have positive and negative values to correspond to positive and negative frequency deviation.

For example, for a total ±5 KHz frequency deviation, the frequency increments can be less than 100 Hz, which is less than one percent (1%) of the 10 KHz peak to peak deviation. This step size assures that the distortion of the modulated waveform will be sufficiently small for communication equipment. In order for the phase locked loop to track the modulation, the closed loop tracking bandwidth must be greater than the highest modulating frequency, or about 3 KHz for typical audio modulating signals. These requirements of small step size and wide bandwidth can be obtained from the frequency shift synthesizer 10 of FIG. 1.

In the frequency shift synthesizer of FIG. 1, the output frequency ($F_o$) can be expressed by:

$$F_o = F_{in} \frac{(P-1)}{P} \text{ (assuming } F_{in} > F_o\text{)}.$$

The step size of the frequecy shift synthesizer is the derivative of the output frequency ($F_o$) with respect to the dividing factor (P), and can be expressed by:

$$df = \frac{\alpha F_o}{\alpha(P)} = F_{in}\left(\frac{1}{P^2}\right).$$

Also, the phase detector frequency ($F_{P.D.}$) can be expressed by:

$$F_{P.D.} = \frac{F_{in}}{P}.$$

As a result, a condition can be set up where the following relationships exist:

$$df \leq \frac{2\Delta F}{100} < F \text{ audio} < \text{loop bandwidth} < F_{p.D.}$$

In words, the frequency step size is less than or equal to twice the peak frequency deviation divided by one-hundred which is less than the highest modulating frequency, which is less than the loop bandwidth, which is less than the phase detector frequency.

As an actual example, the system parameters obtainable from the frequency modulation system illustrated in FIG. 4 to be described hereinafter, are given below wherein the indication "(nominal)" defines that parameter at the center frequency.

$F_{in}$ = 14.434 MHz
P = 424 (nominal)
$F_{P.D.}$ = 34 KHz (nominal)
BW (loop bandwidth) = 3 KHz $$\frac{2\Delta F}{100} = 100 \text{ H}_z$$

$\Delta f$ = Step size = 80 Hz (nominal)
$F_c$ = 14.400 MHz (nominal)

The output frequency can be changed in steps as small as 80 Hz. The changes can be made as often as the period of the phase detector. This corresponds to a sampling rate of 34 KHz and 7-bit precision in the quantization.

As can be noted from the equation expressing the step size (df), as P gets larger (positive frequency deviation), the step size gets smaller. However, the quantization of the modulation is by a linear A/D conversion and assumes a constant step size ($\Delta f$). Although the actual step size of the frequency shift synthesizer is not constant, the desired output frequency can be programmed within an accuracy of ½ the step size (df/2). As a result, and in accordance with the present invention, the exact value of the dividing factor (P) to derive the desired frequency for each amplitude level of the modulating signal can be either computed upon each sample, or the dividing factors can be stored in an addressable memory and addressed according to the quantization level of the modulating signal. For calculating the dividing factor (P), the following expression can be derived through algebraic reduction:

$$F_o = F_c + \Delta f M'$$

$$F_{in}\frac{(P-1)}{P} = F_{in}\left(\frac{P_o - 1}{P_o}\right) + \frac{F_{in}}{P_o^2} M' \text{ for } \Delta f = \frac{F_{in}}{P_o^2}$$

$$P = \frac{P_o^2}{P_o + M_o - M}$$

where
$P_o$ is the nominal value of P;
M is the value of the quantized modulation;
$M_o$ is the nominal center value of the quantized modulation; and
$M' = M - M_o$.

Other choices of $\Delta f$ will result in a different expression for P. However, for whatever value of $\Delta f$ is chosen, the dividing factors can be determined to obtain the precise frequency required within the accuracy of the quantization and the nominal step size.

Figure 2:
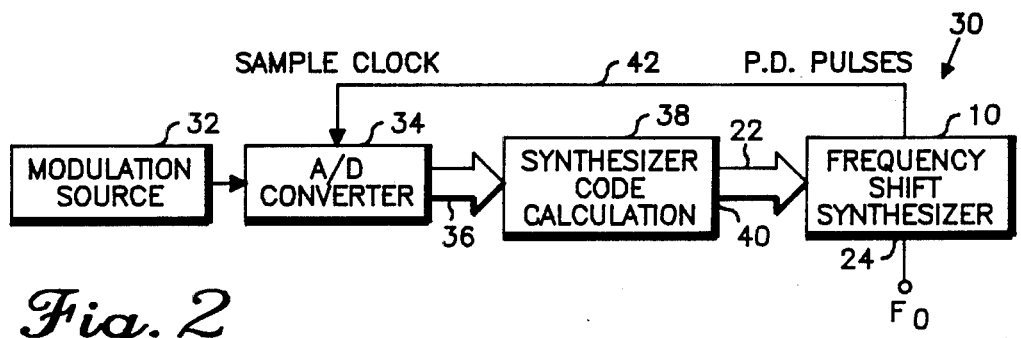
FIG. 2 is a block diagram of a frequency modulation system embodying the present invention.

Referring now to FIG. 2, it illustrates in block diagram form, a digital frequency modulation system 30 embodying the present invention. The system 30 illustrated in FIG. 2 corresponds to the form of system embodying the present invention wherein the values of the dividing factors (P) are calculated as explained above. The system 30 includes a modulation source 32 which is adapted to provide, for example, an analog modulating signal, such as a voice audio signal. The system also includes an analog to digital converter 34 which is coupled to the output of the audio source 32 and provides, for example, an 8-bit digital word at its output 36 corresponding to the amplitude of the modulating signal obtained at each sampling time. In other words, the analog to digital converter 34 converts the analog modulating signal to a digital modulating signal at output 36.

The system 30 further includes a synthesizer code calculation means 38 which receives from the analog to digital converter 34 each 8-bit digital word corresponding to the quantized level of the modulating signal and provides at its output 40, for each quantized value received from the analog to digital converter 34, an 8-bit digital word corresponding to the dividing factor (P) which is impressed upon the control input 22 of the frequency shift synthesizer. The frequency shift synthesizer 10 is coupled back to the analog to digital converter by a line 42 to enable the analog to digital converter 34 for quantizing the analog modulating signal at the phase detector rate. The frequency modulated signal is provided from the frequency shift synthesizer at output 24.

Figure 3:
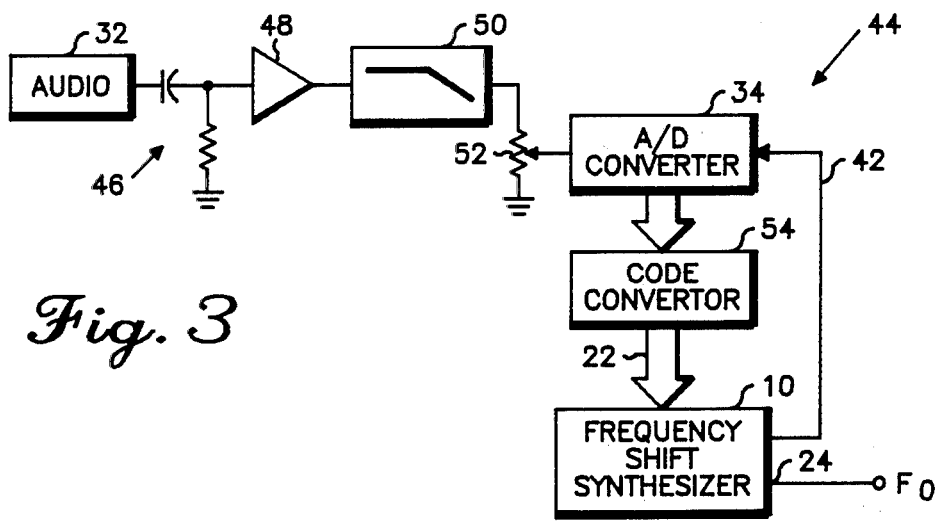
FIG. 3 is a block diagram of another frequency modulation system embodying the present invention.

Referring now to FIG. 3, the system there illustrated in accordance with the present invention includes an audio source 32 which is coupled to an analog modulating signal processing means including a pre-emphasis filter 46, an amplitude clipper 48, and a harmonic filter 50. The pre-emphasis filter 46, clipper 48, and harmonic filter 50 augment the analog modulating signal prior to being quantized by the analog to digital converter 34. Pre-emphasis filters, clippers, and harmonic filters usable for this purpose are well known in the art.

Coupled between the harmonic filter 50 and the analog to digital converter 34 is a level adjusting means comprising a potentiometer 52. The potentiometer 52 adjusts the nominal modulation level to a desired level for the analog to digital converter 34.

The analog to digital converter 34 is coupled to a code converter 54 which can be, for example, an addressable memory wherein all of the values of the dividing factors can be stored. The dividing factors can be addressed responsive to the 8-bit digital words received from the analog to digital converter and can have values corresponding to the expression previously referred to herein for the calculation of the dividing factors (P). The output of the code converter 54 is coupled to the control input 22 of the frequency shift synthesizer (F.S.S.) 10. As in the previous embodiment, the output 24 of the frequency shift synthesizer 10 provides the frequency modulated signal. Also, the line 42 provides sampling clock pulses to the analog to digital converter 34 from the frequency shift synthesizer 10.

Figure 4:
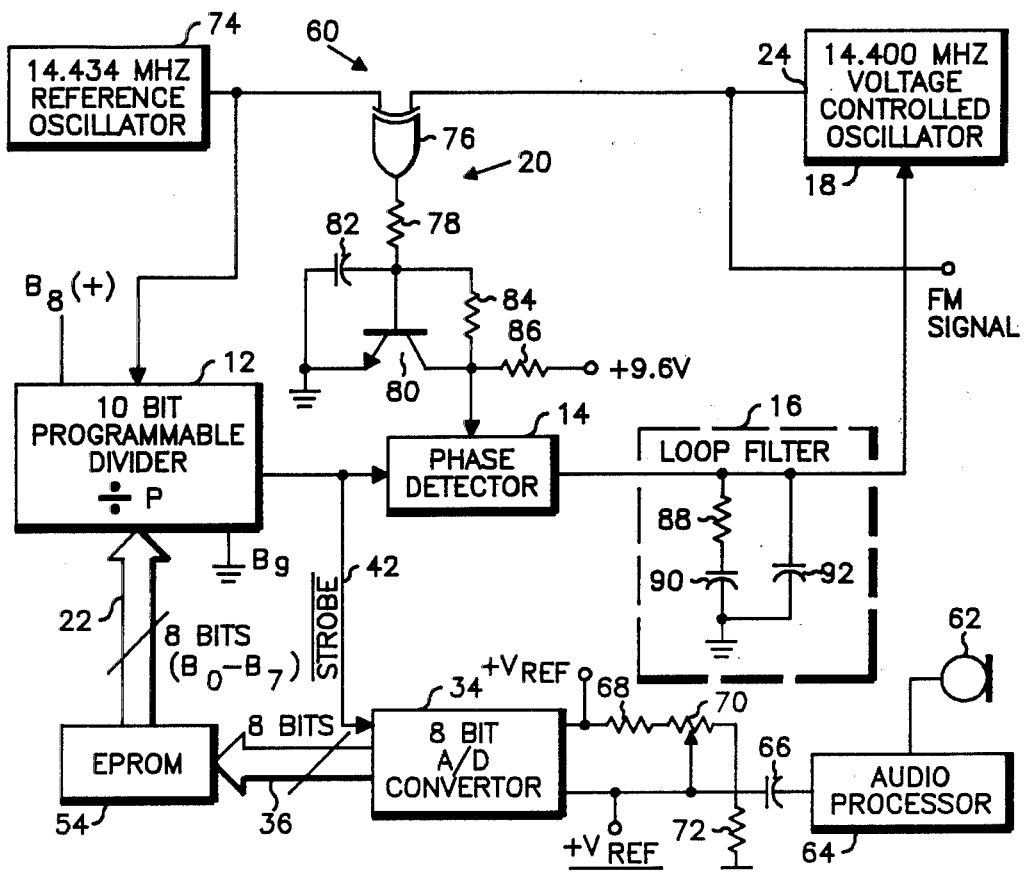
FIG. 4 is a more detailed schematic diagram of a frequency modulation system embodying the present invention and of the type illustrated in FIG. 3.

Referring now to FIG. 4, it illustrates a system similar to the system of FIG. 3 in greater detail. The modulation system 60 of FIG. 4 includes a microphone for generating voice audio modulating signals. An audio processor 64 is coupled to the output of the microphone 62 and can include, for example, a pre-emphasis filter, an amplitude clipper, and a harmonic filter as previously described. The audio processor 64 is capacitively coupled by a capacitor 66 to an analog to digital converter 34 which can be a Ferranti ZN447, 8-bit, analog to digital converter. A resistor divider including resistors 68, potentiometer 70, and resistor 72 are provided for adjusting the modulation level at the input of the analog to digital converter 34.

The analog to digital converter 34 is coupled to a code converter 54 which can be an addressable memory such as a 2K-byte EPROM manufactured by Motorola, Inc. under part No. MCM2716. The EPROM 54 has stored in it all of the dividing factor values previously referred to. Each dividing factor can be individually addressed in response to the particular modulation level represented by the 8-bit digital word transferred from the analog to digital converter 34 to the addressable memory 54. The dividing factors are transferred from the memory 54 to the programmable frequency divider 12 at its input 22. The programmable divider can be, for example, a MC145152 programmable divider manufactured by Motorola, Inc. This divider actually has 10 programming lines. For our example, the MSB is "0" and the next MSB is "1" so that the actual divider input can range between 256 and 511 under control of the 8-bit ROM output.

A reference oscillator 74 providing a substantially constant amplitude, substantially constant frequency of 14.434 MHz is coupled to the programmable divider 12 and a mixer 20. The mixer comprises an exclusive-OR gate which can be a 74 LS86 exclusive-OR gate. The mixer 20 further includes a resistor 78 coupled to the output of the exclusive OR gate 76 and to the base of an NPN transistor 80 which can be, for example, an MPS 6512 NPN transistor manufactured by Motorola, Inc. A capacitor 82 is coupled between the base and emitter of transistor 80, and the emitter is coupled to ground. A resistor 84 is coupled between the collector and base of the transistor 80, and, a resistor 86 is coupled between the collector of the transistor 80 and a 9.6 volt power supply. The output of the mixer, and more particularly, the collector of transistor 80, is coupled to the phase detector 14 which can be, for example, an MC14046 phase detector manufactured by Motorola, Inc. The output from the programmable divider 12 is coupled to the analog to digital converter 34 to provide strobing input pulses to the converter 34.

The output of the phase detector 14 is coupled to a loop filter 16 which includes a resistor 88 and a capacitor 90 coupled in series between the output of the phase detector 14 and ground. The loop filter also includes another capacitor 92 which is coupled in parallel with the series connected resistor 88 and capacitor 90.

The output of the loop filter 16 is coupled to a voltage controlled oscillator 18 having a nominal center frequency of 14.400 MHz. The output of the voltage controlled oscillator is coupled to one of the inputs of the exclusive-OR gate 76 and the output 24 provides the frequency modulated signal having a center frequency of 14.400 MHz and a frequency deviation of ±5 KHz.

Figure 5:
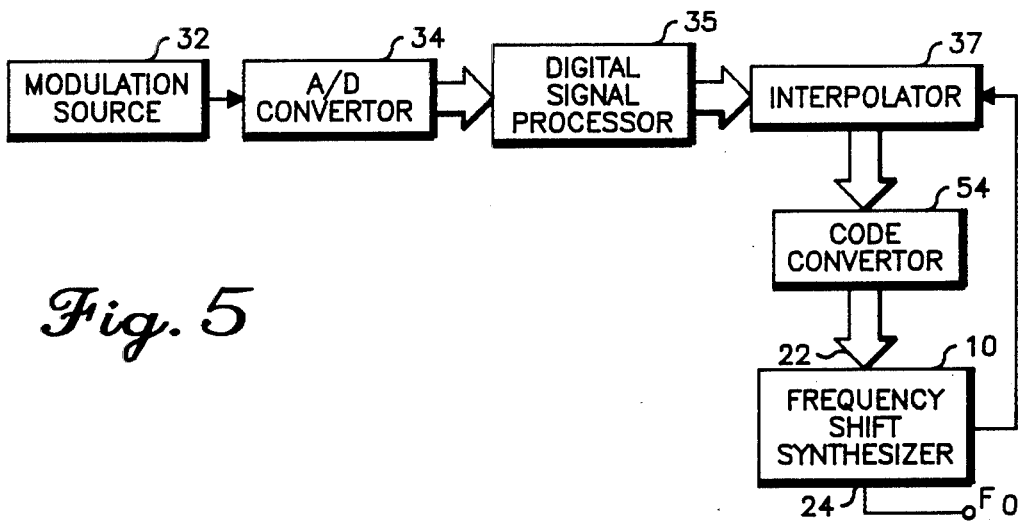
FIG. 5 is a block diagram of another frequency modulation system embodying the present invention.

Referring now to FIG. 5, it illustrates a digital frequency modulation system similar to that of FIG. 3 except that the system of FIG. 5 augments the modulating signals with a digital signal processor after the analog modulating signals have been converted to digital form. The system of FIG. 5 includes a modulation source 32, such as a audio source, which is coupled to an analog to digital converter 34. The output of the analog to digital converter 34 is coupled to the digital signal processor 35 which digitally processes the digitized modulating signal to perform the pre-emphasis, clipping, and harmonic filtering simultaneously and digitally. The digital signal processor 35 eliminates part count within the frequency modulation system, analog parts, and modulation variations which might otherwise require periodic testing and adjustment. Digital signal processors of this type can be readily obtained given the desired pre-emphasis, clipping, and harmonic filtering characteristics.

The output of the digital signal processor 35 is coupled to an interpolator 37 whose function will be described subsequently. The output of the interpolator is coupled to a code converter 54, which, once again, can be an addressable memory as previously described. The output of the code converter or memory 54 is coupled to the control input 22 of a frequency shift synthesizer 10, also as previously described.

The interpolator 37 is provided for interpolating the quantization level of the modulating amplitude from the digital signal processor 35 because the digital signal processor may not function at the same rate as the frequency shift synthesizer because the frequency shift synthesizer phase detector frequency varies. The interpolator 37 thereby reduces jitter that might otherwise occur.

The output 24 of the frequency shift synthesizer provides the frequency modulated signal. The frequency modulated signal at output 24 can be either amplified and transmitted directly, or mixed with a higher frequency carrier before amplification and transmission. This is also possible with the frequency modulated signals obtainable from each of the embodiments previously described.

Although this modulation system has been described in terms of an audio modulating waveform, it is well known that frequency modulation can be used with data signals that characteristically have discrete information levels. It is also known that such signals can cause excess bandwidth of the modulated spectrum unless suitable low pass filtering is done prior to modulation. After low pass filtering, these discrete level signals must be treated as having continuously varying levels and, as such, are similar to analog signals. Thus, this invention also applies to data modulation.

The present invention therefore provides a new and improved frequency modulation system which can process the modulating signals digitally. Exact frequency deviations can be programmed. Also, frequency modulation of a carrier wave by baseband signals with frequency components extending down to and including zero frequency can also be obtained. Furthermore, since the modulating signals can be processed digitally, the signals can be digitally filtered in a manner which negates the need for periodic testing and adjustment of the system. Lastly, the frequency modulated signals obtained from the digital frequency modulator are compatible with other frequency modulated signals which may be generated by prior art analog systems.

What is claimed is:

1. In a frequency modulation system of the type which transforms an analog modulating signal to a signal substantially constant in amplitude by varying in frequency from a center frequency responsive to a characteristic of said analog modulating signal, the improvement comprising:
   frequency synthesizer means including an output and not more than one frequency control input for receiving digital frequency control signals and for varying the output frequency at said output by an amount related to said digital frequency control signals; and
   digital frequency control signal generating means coupled to said frequency control input for providing said frequency control input with said digital frequency control signals in response to said characteristic of said analog modulating signal; and
   means for synchronizing said digital frequency control signal generating means with said frequency synthesizer means.

2. A frequency modulation system as defined in claim 1 wherein said frequency synthesizer means comprises a frequency shift synthesizer including a frequency divider for varying the output frequency by an amount related to a dividing factor, and wherein said digital frequency control signal generating means comprises dividing factor generating means for providing said control input with said dividing factor in response to said characteristic of said modulating signal.

3. A frequency modulation system as defined in claim 2 wherein said dividing factor generating means is a range for providing said dividing factor in response to the amplitude of said analog modulating signal.

4. A frequency modulation system as defined in claim 3 further including converter means for converting said analog modulating signal to a digital modulating signal.

5. A frequency modulation system as defined in claim 4 wherein said converter means comprises an analog to digital converter.

6. A frequency modulation system as defined in claim 3 wherein said dividing factor generating means includes memory means for storing said dividing factors in digital form and addressing said dividing factors responsive to the amplitude of said analog signal.

7. A frequency modulation system as defined in claim 6 further including an analog to digital converter coupled between said analog signal and said memory means.

8. A frequency modulation system as defined in claim 3 wherein said dividing factor generating means includes calculating means for calculating said dividing factor responsive to the amplitude of said analog signal.

9. A frequency modulation system as defined in claim 3 further comprising analog signal processing means coupled between said analog signal and said dividing factor generating means for augmenting said analog signal prior to the generation of said dividing factor.

10. A frequency modulation system as defined in claim 9 wherein said analog signal processing means includes a pre-emphasis filter.

11. A frequency modulation system as defined in claim 9 wherein said analog signal processing means includes an amplitude clipper.

12. A frequency modulation system as defined in claim 9 wherein said analog signal processing means includes a harmonic filter.

13. A frequency modulation system as defined in claim 4 wherein said system further includes digital signal processing means coupled between said converter means and said dividing factor generating means for augmenting said digital modulating signal.

14. A frequency modulation system as defined in claim 13 wherein said digital signal processing means comprises a pre-emphasis filter.

15. A frequency modulation system as defined in claim 13 wherein said digital signal processing means comprises an amplitude clipper.

16. A frequency modulation system as defined in claim 13 wherein said digital signal processing means comprises a harmonic filter.

17. A method of providing a signal varying in frequency from a center frequency by an amount related to a characteristic of an analog modulating signal, said method comprising the steps of:
   providing a frequency synthesizer of the type having an output and not more than one frequency control input which varies the output frequency in response to digital frequency control signals received at said control input;
   generating said digital frequency control signals in response to said characteristic of said modulating signal; and
   conveying said digital control signals to said control input; and synchronizing said digital frequency control with said frequency synthesizer.

18. A method as defined in claim 17 wherein said frequency synthesizer is a frequency shift synthesizer of the type having a frequency divider and which varies the output frequency in response to dividing factors received at said control input, and wherein said step of generating said digital frequency control signals includes generating said dividing factors.

19. A method as defined in claim 18 wherein said dividing factors are generated in response to the amplitude of said analog modulating signal.

20. A method as defined in claim 19 including the further steps of converting said analog modulating signal to a digital modulating signal and generating said dividing factors responsive to said digital modulating signal.

21. A method as defined in claim 20 including the further step of storing dividing factors in an addressable memory, addressing said dividing factors responsive to said digital modulating signal, and conveying said addressed dividing factors to said control input.

22. A method as defined in claim 20 including the further steps of calculating said dividing factors responsive to said digital modulating signal and conveying said calculated dividing factors to said control input.

23. A method as defined in claim 19 further including the step of augmenting said analog modulating signal prior to generating said dividing factors.

24. A method as defined in claim 23 wherein said augmenting step includes pre-emphasizing said analog modulating signal.

25. A method as defined in claim 23 wherein said augmenting step includes amplitude clipping said analog modulating signal.

26. A method as defined in claim 23 wherein said augmenting step includes harmonic filtering said analog modulating signal.

27. A method as defined in claim 20 including the further step of digitally pre-emphasizing said digital modulating signal prior to generating said dividing factors.

28. A method as defined in claim 20 including the further step of digitally clipping said digital modulating signal prior to generating said dividing factors.

29. A method as defined in claim 20 including the further step of digitally harmonic filtering said digital modulating signal prior to generating said dividing factors.

* * * * *